US010442623B2

(12) United States Patent
Izumi

(10) Patent No.: US 10,442,623 B2
(45) Date of Patent: Oct. 15, 2019

(54) TRAVELLING VEHICLE SYSTEM

(71) Applicant: MURATA MACHINERY, LTD., Kyoto-shi, Kyoto (JP)

(72) Inventor: Takanori Izumi, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 15/949,199

(22) Filed: Apr. 10, 2018

(65) Prior Publication Data

US 2018/0290832 A1   Oct. 11, 2018

(30) Foreign Application Priority Data

Apr. 11, 2017 (JP) .................................. 2017-078245

(51) Int. Cl.
| | |
|---|---|
| *B61B 3/00* | (2006.01) |
| *B65G 9/00* | (2006.01) |
| *H01L 21/677* | (2006.01) |

(52) U.S. Cl.
CPC ............... *B65G 9/008* (2013.01); *B61B 3/00* (2013.01); *H01L 21/6773* (2013.01); *H01L 21/67706* (2013.01); *H01L 21/67724* (2013.01); *H01L 21/67727* (2013.01); *H01L 21/67733* (2013.01)

(58) Field of Classification Search
CPC .... B65G 9/008; B65G 2207/22; B65G 43/02; H01L 21/67706; H01L 21/67724; H01L 21/67727; H01L 21/6773; H01L 21/67733; A63H 18/021; A62C 2/22; B61B 5/02; B61B 3/00; E05Y 2900/134; E01B 25/00

USPC ..................................... 238/10 R, 10 E, 10 F
See application file for complete search history.

(56) References Cited

U.S. PATENT DOCUMENTS

| | | | | |
|---|---|---|---|---|
| 2,573,160 A | * | 10/1951 | Norman .................... | A62C 2/18 16/80 |
| RE30,454 E | * | 12/1980 | Birdsall ................. | A63H 18/02 104/305 |
| 4,753,337 A | * | 6/1988 | Grosjean .................. | A62C 2/22 198/583 |

(Continued)

FOREIGN PATENT DOCUMENTS

| | | |
|---|---|---|
| JP | 11-301464 A | 11/1999 |
| JP | 2004-058741 A | 2/2004 |
| JP | 2005-138658 A | 6/2005 |

(Continued)

*Primary Examiner* — Mark T Le
(74) *Attorney, Agent, or Firm* — Keating & Bennett, LLP

(57) ABSTRACT

A movable rail is retracted even when positions of an upstream rail and a downstream rail fluctuate, and an increase in distance between the upstream rail or the downstream rail and the movable rail is reduced or prevented. The movable rail is movable between a first position and a second position, and an extendable rail is provided on the upstream rail. The extendable rail includes one end coupled with the upstream rail and the other end defining a free end, and extending and contracting with an elastic member. The extendable rail contracts while leaving room for the other end of the extendable rail to be pushed by the movable rail moving toward the first position and further contract. When the movable rail moves to the second position, a space through which a fire shutter provided in the building is able to pass is provided between the other end and the downstream rail.

3 Claims, 9 Drawing Sheets

(56) References Cited

U.S. PATENT DOCUMENTS 4,885,981 A * 12/1989 Roettger ............. F16K 31/1221
                                                                                                 92/59
2019/0112131 A1 * 4/2019 Hosaka .................. B65G 35/06

FOREIGN PATENT DOCUMENTS

| JP | 2005138658 A | * | 6/2005 |
| JP | 2011-042306 A | | 3/2011 |
| JP | 2014-054660 A | | 3/2014 |

* cited by examiner

TRAVELLING VEHICLE SYSTEM

CROSS REFERENCE TO RELATED APPLICATIONS

This application claims the benefit of priority to Japanese Patent Application No. 2017-078245 filed on Apr. 11, 2017. The entire contents of this application are hereby incorporated herein by reference.

BACKGROUND OF THE INVENTION

1. Field of the Invention

The present invention relates to a travelling vehicle system.

2. Description of the Related Art

In a semiconductor manufacturing factory or the like, a travelling vehicle system for travelling along a travelling rail laid on a ceiling is used to convey various containers (a FOUP, a reticle pod, etc.) containing semiconductor wafers or reticles. In such a building of the manufacturing factory, a fire protection zone is set based on the requirements of the Fire Services Act, and the fire protection zone may be formed by a fire shutter provided in the building. However, in a space through which the fire shutter passes, the travelling rail of the travelling vehicle system may be disposed. In order to close the fire shutter, therefore, a configuration has been proposed in which a part of the travelling rail is a movable rail that is retracted from the space through which the fire shutter passes so that the fire shutter is closed (e.g., see Japanese Patent No. 4193174).

In the travelling vehicle system described above, an upstream rail and a downstream rail may be attached to a system ceiling provided in the building. In this case, if the position of the system ceiling horizontally fluctuates due to an earthquake or the like, the positions of the upstream rail and the downstream rail may also fluctuate, and the movable rail may then be held between the upstream rail and the downstream rail and become unmovable. This may interfere with closing the fire shutter. Further, the distance between the upstream rail or the downstream rail and the movable rail increases due to fluctuation of the position of the system ceiling, and in this case, there is a problem where the travelling vehicle cannot travel or vibration to the travelling vehicle increases during its travel.

SUMMARY OF THE INVENTION

In view of the circumstances described above, preferred embodiments of the present invention provide travelling vehicle systems that are able to retract a movable rail even when positions of an upstream rail and a downstream rail fluctuate, and are able to reduce or prevent an increase in distance between the upstream rail or the downstream rail and the movable rail.

A preferred embodiment of the present invention provides a travelling vehicle system including travelling rails for a travelling vehicle. The travelling rails include an upstream rail and a downstream rail attached to a system ceiling provided in a building, a movable rail movable between a first position at which the movable rail communicates with the upstream rail and the downstream rail and a second position shifted obliquely to an extending direction of the travelling rails, and an extendable rail provided on one of the upstream rail and the downstream rail, the rail including one end coupled with the upstream rail or the downstream rail and the other end as a free end, and extending and contracting with an elastic member. The extendable rail contracts while leaving room for the other end of the extendable rail to be pushed by the movable rail moving toward the first position and further contract. When the movable rail moves to the second position, a space through which a fire shutter provided in the building is able to pass is provided between the other end and the upstream rail or the downstream rail.

A guide roller may be provided on one of the movable rail and the extendable rail, the guide roller coming into contact with the other rail and rolling when the movable rail moves toward the first position. A recess may be provided on the other rail, the recess being where the guide roller enters when the movable rail reaches the first position. The extendable rail may include a guide provided along the extending direction of the travelling rails, and a plurality of segment rails movable along the guide. The elastic member may be provided between each of the plurality of segment rails. A stopper may be provided on the upstream rail or the downstream rail, the stopper restricting the movable rail from moving beyond the first position in a direction in which the movable rail moves from the second position toward the first position.

According to a travelling vehicle system of a preferred embodiment of the present invention, when the movable rail is disposed at the first position, the extendable rail comes into a contracted state, so that even when the positions of the upstream rail and the downstream rail fluctuate, the extendable rail is able to be held in a favorably connected state with the movable rail by extending and contracting. Hence, it is possible to reliably retract the movable rail toward the second position and close the fire shutter. Further, the distance between the upstream rail or the downstream rail and the movable rail is prevented from becoming wider, to avoid the travelling vehicle becoming unable to travel or to avoid causing vibration to be applied to the travelling vehicle, so that smooth travelling of the vehicle is ensured.

When the guide roller is provided on one of the movable rail and the extendable rail and the recess is provided on the other rail, the movable rail and the extendable rail are able to be smoothly connected by the guide roller, and the guide roller enters the recess, so that the movable rail and the extendable rail are able to be positioned with ease. When the extendable rail includes the guide and the segment rails and the elastic member is provided between each of the plurality of segment rails, the extension and contraction in the extendable rail are able to be ensured with ease, and further by changing the number of the segment rails, the length of the extendable rail is able to be adjusted with ease.

When a stopper is provided on the upstream rail or the downstream rail, the stopper restricting the movable rail from moving beyond the first position in the direction in which the movable rail moves from the second position toward the first position, it is possible to prevent the movable rail from moving beyond the first position, and reliably ensure the connection between the movable rail and the extendable rail.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A illustrates a state in which the movable rail is at a first position, and FIG. 3B illustrates a state in which the movable rail is at a second position.

FIG. 5A illustrates a state in which a guide roller is in contact with a guide surface, and FIG. 5B illustrates a state in which the guide roller has entered the recess.

FIG. 6A illustrates a state in which the two rails are separated from each other, and FIG. 6B illustrates a state in which the rails are connected to each other.

FIG. 7A illustrates a state in which the two rails are separated from each other, and FIG. 7B illustrates a state in which the two rails are connected to each other.

DETAILED DESCRIPTION OF THE PREFERRED EMBODIMENTS

Figure 1:
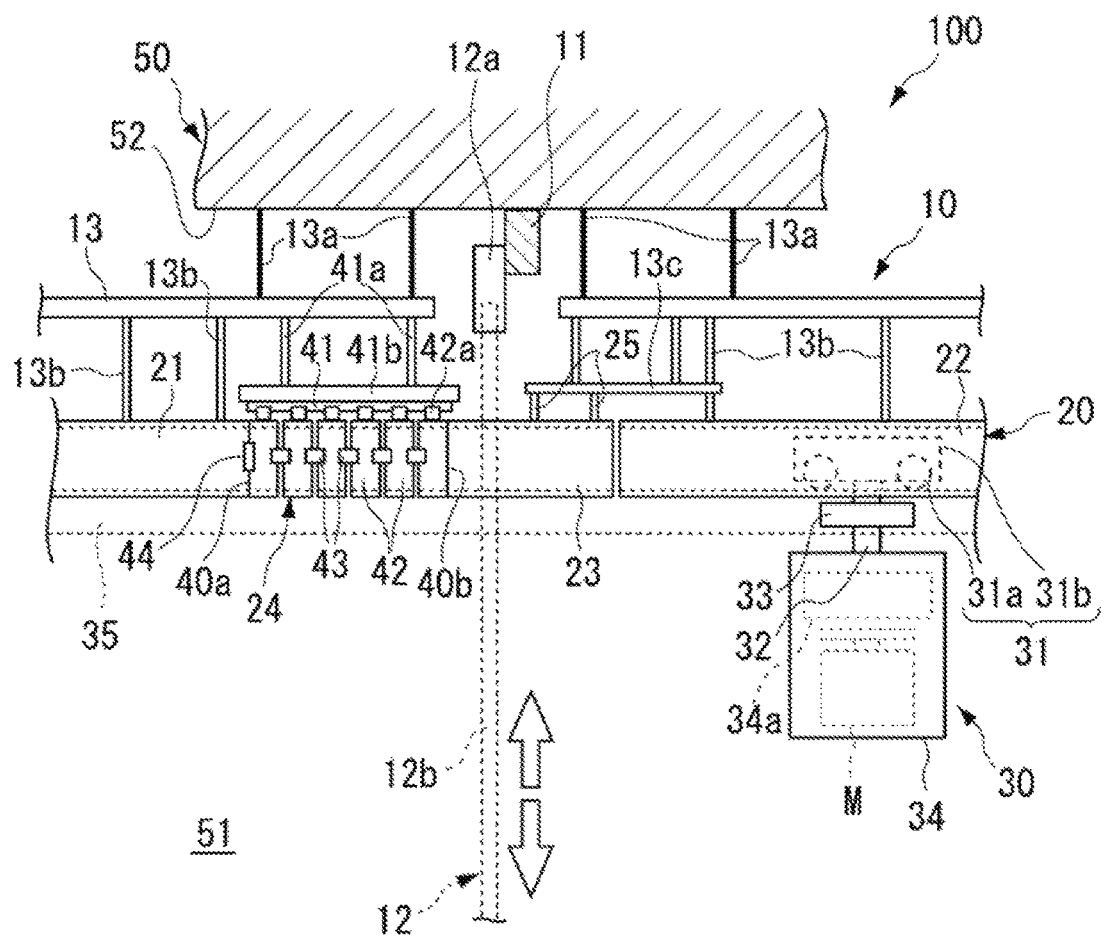
FIG. 1 is a view illustrating an example of a travelling vehicle system according to a preferred embodiment of the present invention.
Figure 1:
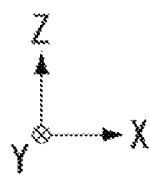

Hereinafter, preferred embodiments of the present invention will be described with reference to the drawings. However, the present invention is not limited thereto. In the drawings, illustration is made appropriately changing a scale size, such as partial enlargement or emphasis, so as to describe the preferred embodiments. In each of the following figures, a direction in the figure will be described using an XYZ coordinate system. In this XYZ coordinate system, the plane parallel to the horizontal plane is an XY plane.

In this XY plane, a travelling direction of a travelling vehicle 30 is denoted as an X direction, and a direction orthogonal to the X direction in the horizontal direction is denoted as a Y direction. Although the travelling direction of the travelling vehicle 30 changes from the state illustrated in the following figure to another direction, in the present specification, the travelling direction of the travelling vehicle 30 will be described as the X direction. Further, a direction perpendicular to the XY plane is denoted as a Z direction. Each of the X direction, the Y direction, and the Z direction is described assuming that a direction of an arrow in the drawing is a +(plus) direction, and a direction opposite to the direction of the arrow is a −(minus) direction.

FIG. 1 is a side view illustrating an example of a travelling vehicle system 100. As illustrated in FIG. 1, the travelling vehicle system 100 is provided so as to pass through an area that defines a fire protection structure 10, and includes a travelling rail 20 and a travelling vehicle 30.

The fire protection structure 10 includes a fire door 12 attached to a fire wall 11. The fire wall 11 surrounds a fire protection zone 51 in a building 50. Note that the fire protection zone 51 preferably surrounds a predetermined area of the building 50 according to the requirements of the Fire Services Act or the like. The fire wall 11 is provided integrally with the building 50 in a ceiling 52 of the building 50, using concrete, a refractory panel, or the like. The ceiling 52 includes a system ceiling 13.

As illustrated in FIG. 1, the system ceiling 13 is attached to the ceiling 52 of the building 50. The system ceiling 13 is supported in the state of being suspended from the ceiling 52 by a plurality of suspension members 13a. Note that the supporting structure for the system ceiling 13 is not limited to the suspension support by the suspension members 13a, and another supporting structure may be used. The system ceiling 13 is disposed on each side, with the fire wall 11 located therebetween.

As illustrated in FIG. 1, the fire door 12 includes a fire door body 12a and a fire shutter 12b. The fire door 12 is attached to an opening, not illustrated, provided in a portion of the fire wall 11, and the opening of the fire wall 11 can be closed by lowering the fire shutter 12b. The fire door body 12a is fixed to the fire wall 11 by a fixing member, not illustrated. The fire door body 12a includes an accommodation portion to accommodate the fire shutter 12b at its upper end. For example, a plate-shaped member having a certain degree of thickness is used as the fire shutter 12b, and the fire shutter 12b is lowered from the accommodation portion of the fire door body 12a by an operator manually or by a shutter driver, not illustrated, or the like. The fire shutter 12b may be lowered along a guide provided on the fire door body 12a or the fire wall 11. The fire shutter 12b is able to open and close the opening of the fire wall 11 by being lifted and lowered with respect to the fire door body 12a.

On the travelling rail 20, a plurality of travelling vehicles 30 travel. The travelling rail 20 includes an upstream rail 21, a downstream rail 22, a movable rail 23, and an extendable rail 24. The upstream rail 21 and the downstream rail 22 are each supported by the plurality of suspension members 13b in the state of being suspended from the system ceiling 13. The upstream rail 21 and the downstream rail 22 are disposed along the travelling direction of the travelling vehicle 30. In the present preferred embodiment, the upstream rail 21 and the downstream rail 22 are disposed along the X direction. As for the names of the upstream rail and the downstream rail, the rail disposed upstream in the travelling direction of the travelling vehicle 30 is referred to as the upstream rail, and the rail disposed downstream in the travelling direction of the travelling vehicle 30 is referred to as the downstream rail.

In the present preferred embodiment, with the travelling vehicle 30 travelling in the +X direction, the rail disposed on the −X side of the travelling rail 20 is taken as the upstream rail 21 and the rail disposed on the +X side is taken as the downstream rail 22, but this is not restrictive. For example, when the travelling vehicle 30 travels in the −X direction, the rail disposed on the +X side becomes the upstream rail and the rail disposed on the −X side becomes the downstream rail. A space is provided between the upstream rail 21 and the downstream rail 22, in which the movable rail 23 and the extendable rail 24 described later are disposed. The upstream rail 21 and the downstream rail 22 are set at the same or almost the same height. This enables smooth travelling of the travelling vehicle 30 between the upstream rail 21 and the downstream rail 22.

Figure 2:
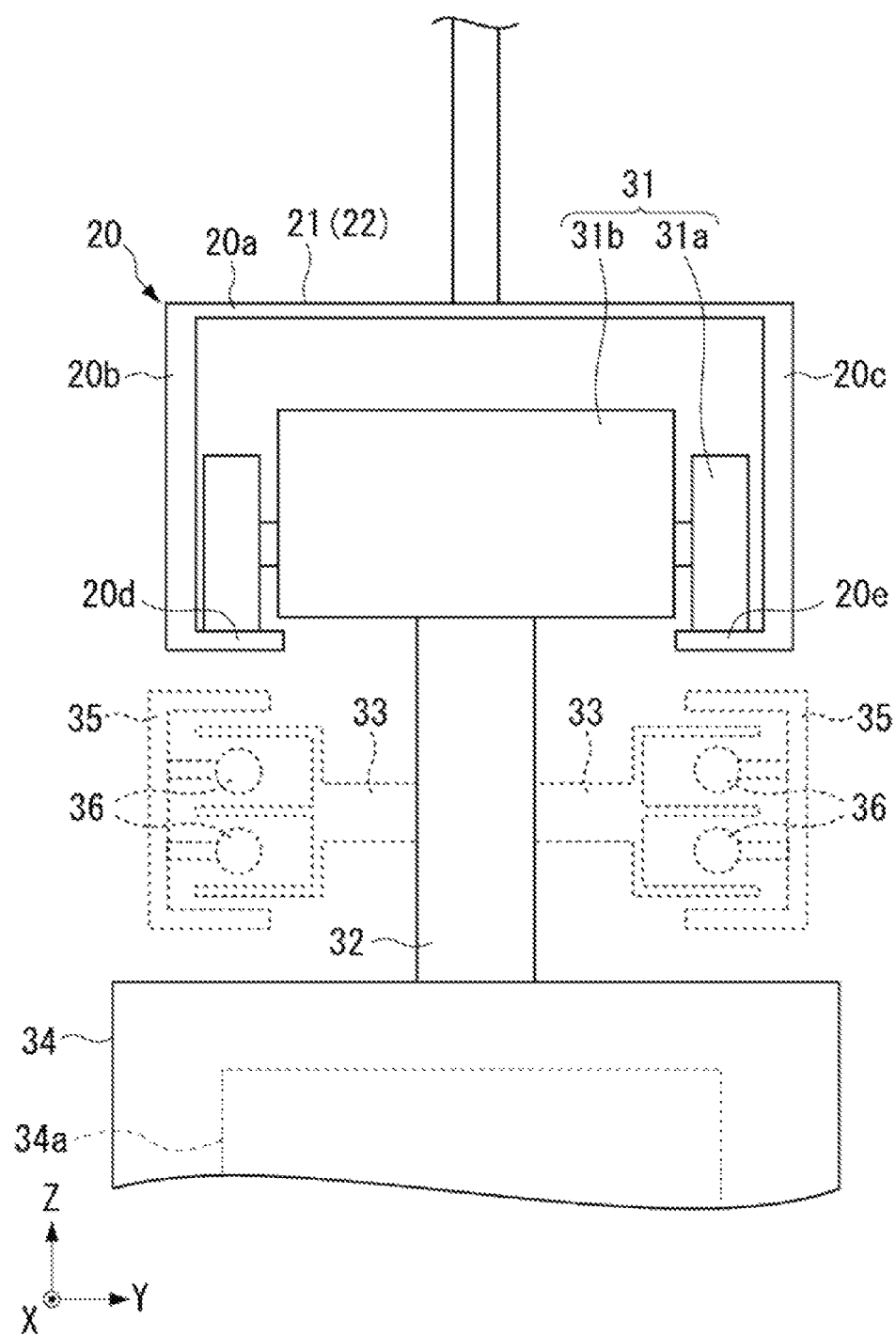
FIG. 2 is a sectional view illustrating a portion of a travelling rail and a travelling vehicle.

FIG. 2 is a sectional view illustrating a portion of the travelling rail 20 and the travelling vehicle 30. As illustrated in FIG. 2, the upstream rail 21 and the downstream rail 22 are provided in a state in which plate-shaped portions at five locations, for example, are connected to one another in the section view, the plate-shaped portions being an upper plate-shaped portion 20a, a side plate-shaped portion 20b on the −Y side, a side plate-shaped portion on the +Y side 20c, a lower plate-shaped portion 20d on the −Y side, and a lower plate-shaped portion 20e on the +Y side.

As illustrated in FIG. 2, the travelling vehicle 30 includes a travelling driver 31, a coupler 32, a power receiver 33, a body 34, and a transfer device 34a. The travelling driver 31 includes a plurality of travelling wheels 31a in contact with the upper surfaces of the lower plate-shaped portions 20d and 20e of the travelling rail 20 and a driver 31b that rotationally drives the plurality of travelling wheels 31a. At least one of the plurality of travelling wheels 31a is a drive wheel, for example. Further, for example, an electric motor, a linear motor, or the like is used as the driver 31b.

The coupler 32 extends downward from the travelling driver 31 to couple the travelling driver 31 with the body 34. The power receiver 33 is provided in a portion of the coupler 32. The power receiver 33 receives power via non-contact power feeders 36 provided in a power supply rail 35, and supplies power to the travelling driver 31 and the like. The non-contact power feeders 36 are arranged continuously or intermittently along the upstream rail 21 and the downstream rail 22. In FIG. 1 and the like, the power supply rail 35 is omitted.

The body 34 includes a cover to hold and accommodate an article M (see FIG. 1), and a transfer device 34a to transfer the held article M. The transfer destination of the article M is, for example, a load port of a storage device such as a stocker or a buffer, or a load port of a processing device. The transfer device 34a includes, for example, a lateral drawing mechanism that holds and projects the article M in the Y direction, a lifting/lowering mechanism that moves the article M downward, and the like, and drives these lateral drawing mechanism and lifting/lowering mechanism to deliver the article M to the transfer destination. A controller, not illustrated, controls the driving of the travelling driver 31 and the transfer device 34a, though not illustrated.

Figure 3A:
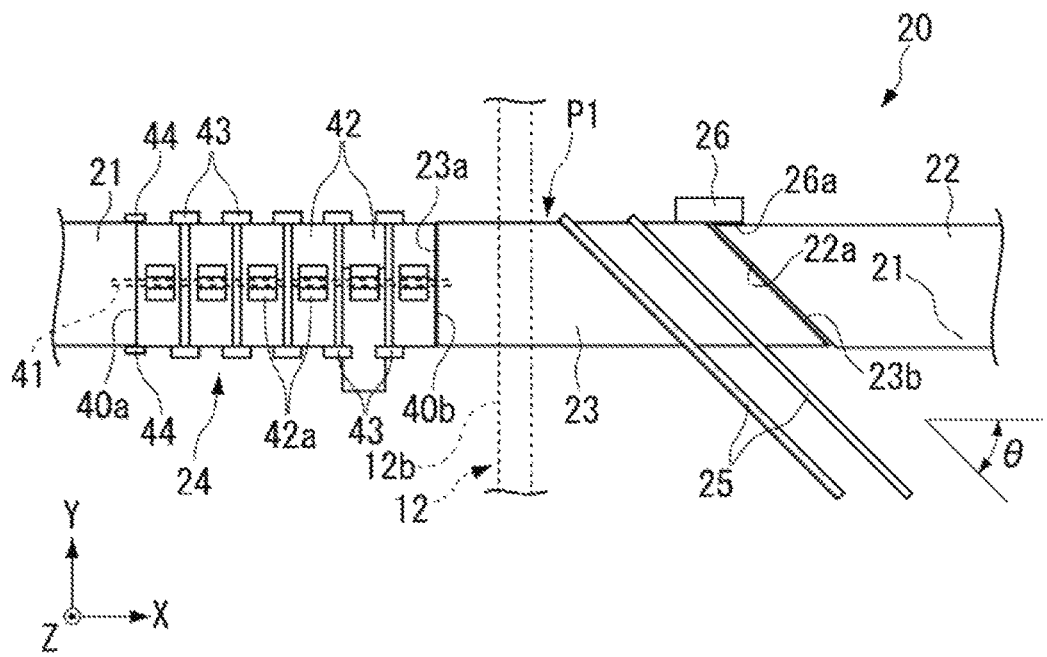
FIGS. 3A and 3B are plan views illustrating operation of a movable rail, where
Figure 3B:
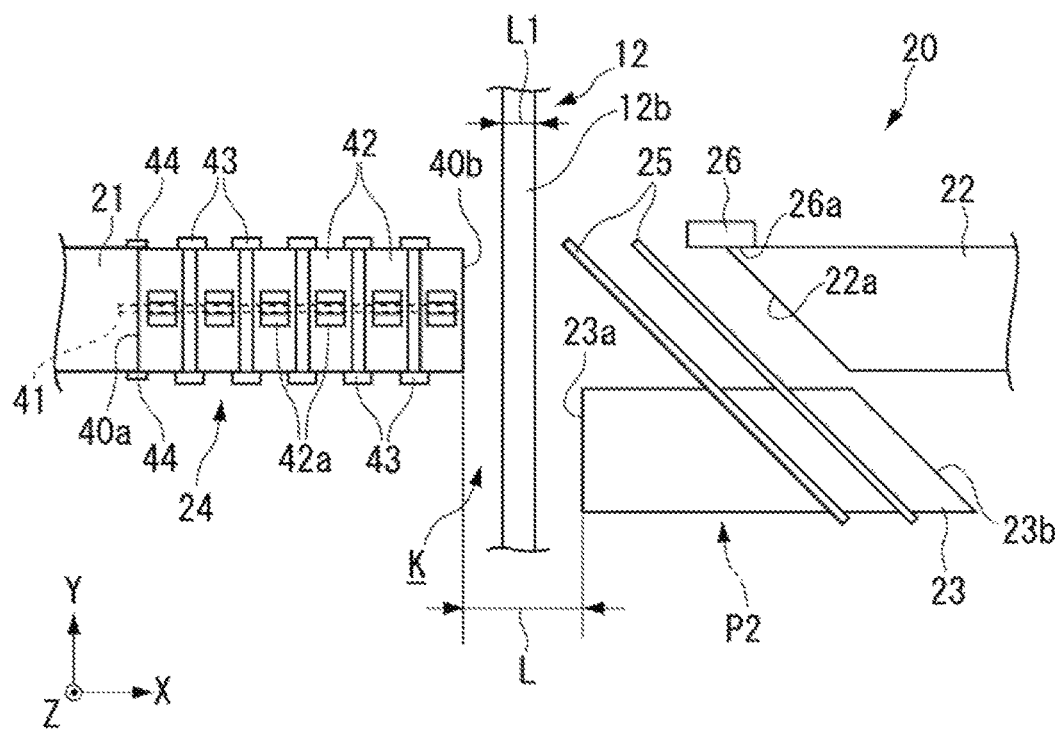

As illustrated in FIG. 1, the movable rail 23 is disposed between the upstream rail 21 and the downstream rail 22. The movable rail 23 is movable along a guide 25 between a first position P1 and a second position P2. The first position P1 and the second position P2 will be described in FIGS. 3A and 3B. FIGS. 3A and 3B are plan views illustrating the operation of the movable rail, where FIG. 3A illustrates a state in which the movable rail is at the first position, and FIG. 3B illustrates a state in which the movable rail is at the second position.

As illustrated in FIG. 3A, the first position P1 is a position at which the movable rail 23 establishes communication between the upstream rail 21 and the downstream rail 22 to enable travelling of the travelling vehicle 30. That is, when the movable rail 23 is disposed at the first position P1, the travelling vehicle 30 can travel from the upstream rail 21 to the downstream rail 22 via the movable rail 23. In the case where the movable rail 23 is disposed at the first position P1, for example, the movable rail 23 brings the upstream rail 21 and the downstream rail 22 into contact with each other to enable travelling of the travelling vehicle 30, but for example, a gap may be formed between the end surface 23b on the downstream side (+X side) of the movable rail 23 and the end surface 22a on the upstream side (−X side) of the downstream rail 22, into which the travelling wheel 31a of the travelling vehicle 30 does not fall while passing thereover (i.e., a gap over which the travelling vehicle 30 can travel).

When the movable rail 23 is disposed at the first position P1, the movable rail 23 is disposed on a track where the fire shutter 12b of the fire door 12 passes. The movable rail 23 at the first position P1 is set at the same, or almost the same, height as the upstream rail 21 and the downstream rail 22. This enables the travelling vehicle 30 to smoothly travel between the upstream rail 21 and the movable rail 23 and between the movable rail 23 and the downstream rail 22. When the movable rail 23 is disposed at the first position P1, for example, a magnet or the like may be used to prevent positional displacement of the movable rail 23 such that the position is not displaced due to elastic force received from the extendable rail 24 described later or frictional force generated by travelling of the travelling vehicle 30. The magnet or the like is, for example, an electromagnet disposed on a portion of the downstream rail 22 or the extendable rail 24 described later, and may attract a portion of the movable rail 23 disposed at the first position P1 to hold the movable rail 23 at the first position P1.

Further, the movable rail 23 may be in the state of always being pulled toward the second position P2 by an elastic member such as a spring or a wire suspending a weight. Even when the movable rail 23 is in the state of being pulled toward the second position P2, it is possible to hold the movable rail 23 at the first position P1 by attracting a portion of the movable rail 23 with the electromagnet described above. Further, the movable rail 23 may be moved from the second position P2 toward the first position P1 by a drive device, not illustrated, or may be manually performed by the operator.

As illustrated in FIG. 3B, the second position P2 is a position shifted obliquely to the extending direction of the travelling rails 20 (the upstream rail 21 and the downstream rail 22). The moving direction of the movable rail 23 is set parallel or substantially parallel to the horizontal plane. When the movable rail 23 moves to the second position P2, the movable rail 23 is disposed at a position deviating from the track where the fire shutter 12b of the fire door 12 passes. Therefore, by moving to and from the first position P1, the movable rail 23 is able to advance to or retract from the track where the fire shutter 12b of the fire door 12 passes. Note that the moving direction of the movable rail 23 is not limited to being parallel or substantially parallel to the horizontal plane, and for example, the second position P2 may be set obliquely upward with respect to the first position P1, and the moving direction of the movable rail 23 may be set obliquely to the horizontal plane.

Also, for example when the occurrence of a fire or the like is confirmed, the power supply to the electromagnet holding the movable rail 23 at the first position P1 is cut off or cut off by the operator, so that the magnetic force of the electromagnet is zero or weak. Hence, the movable rail 23 is pulled by the elastic member or the wire and moved to the second position P2. As a result, the space K through which the fire shutter 12b passes is ensured, and the fire shutter 12b is able to be automatically or manually lowered, thus providing the fire protection zone 51. That the power supply to the electromagnet has been cut off may be notified to the controller, not illustrated, of the travelling vehicle system 100. In this case, the controller may determine that the movable rail 23 has moved to the second position P2 and cause the travelling vehicle 30 not to travel at this position.

Figure 4:
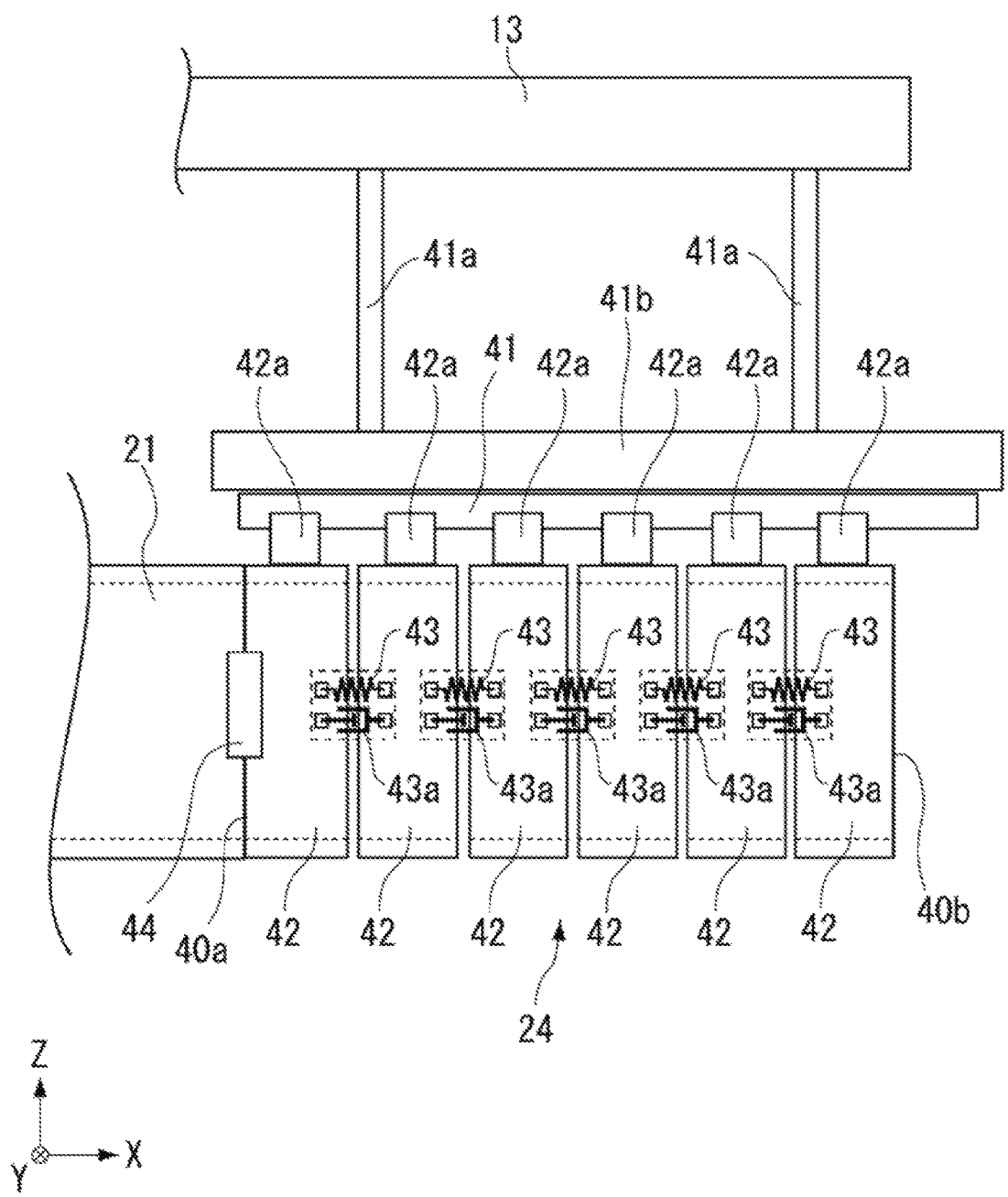
FIG. 4 is a view illustrating an example of an extendable rail.

FIG. 4 is a view illustrating an example of the extendable rail 24. As illustrated in FIG. 4, the extendable rail 24 is provided on the +X end side (the end side facing the downstream rail 22) of the upstream rail 21. The extendable rail 24 can extend and contract in the extending direction (the X direction) of the travelling rail 20. The extendable rail 24 includes a guide 41, a plurality of segment rails 42, and a plurality of elastic members 43. The guide 41 is provided on the lower surface side of the base 41b suspended from the system ceiling 13 by a plurality of suspension members 41a above the extendable rail 24, and disposed along the extending direction (the X direction) of the travelling rail 20. The guide 41 guides the slider 42a provided on the upper surface of each of the plurality of segment rails 42 in the X direction. Note that the guide 41 illustrated in FIG. 4 is an example and may be disposed on the side of the segment rail 42. Alternatively, there may be no guide 41 provided.

The shape and dimensions of each of the plurality of segment rails 42 in the section view are the same or almost the same as those of the upstream rail 21 and the downstream rail 22 illustrated in FIG. 2. Although the lengths of the plurality of segment rails 42 in the X direction are the same or almost the same, the length of some of the segment rails 42 in the X direction may be made larger or smaller. The plurality of segment rails 42 are disposed side by side in the X direction at predetermined intervals. In other figures including FIG. 4, the interval between each of the segment rails 42 is shown in an enlarged manner to illustrate the present preferred embodiment. The plurality of segment rails 42 are disposed so as to have the same or almost the same height. Hence, the travelling vehicle 30 can smoothly travel between the segment rails 42. Further, each segment rail 42 includes a slider 42a on its upper surface and is movable in the X direction along the guide 41.

The elastic member 43 couples the plurality of segment rails 42 with each other. As the elastic member 43, a spring, rubber, or the like is used. The elastic member 43 is able to extend and contract in the X direction. By the plurality of segment rails 42 moving in the X direction along the guide 41, each of the elastic members 43 extends and contracts in the X direction. In the extendable rail 24, the interval is provided between each of the plurality of segment rails 42, and the interval is able to be changed by the elastic member 43 extending and contracting. Hence, an entirety of the extendable rail 24 is able to extend and contract in the X direction. A damper 43a is attached between the plurality of segment rails 42. Each damper 43a is disposed in the vicinity of each elastic member 43. The damper 43a buffers the sudden change of the interval between each of the segment rails 42 due to extension and contraction of the elastic member 43 or the like. However, whether or not the damper 43a is disposed is arbitrary, and the damper 43a may be omitted.

The extension and contraction amount of the extendable rail 24 as a whole is adjustable with ease by changing the number of the segment rails 42 or by exchanging the elastic members 43 for other elastic members 43 having different transformation amounts. Further, adjusting the number of segment rails 42 facilitates adjusting the extendable rail 24 to a desired length. Moreover, the number of the segment rails 42 is settable in a freely selectable manner, and the plurality of segment rails 42 having different lengths in the X direction may be combined to define the extendable rail 24.

In the extendable rail 24, a first end (one end) 40a is coupled with the upstream rail 21 by the fixing member 44, and a second end (the other end) 40b is a free end. In FIGS. 3A and 3B, the guide 41 is indicated by a dotted line. The second end 40b of the extendable rail 24 is pushed and contracted upstream (in the −X direction) by the movable rail 23 that moves toward the first position P1. When the movable rail 23 is disposed at the first position, the extendable rail 24 contracts while leaving room for further contracting as illustrated in FIG. 3A.

Although the extendable rail 24 extends in the +X direction when the movable rail 23 moves to the second position P2, the extendable rail 24 and the movable rail 23 come into the state of being separated from each other by a distance L. Thus, as illustrated in FIG. 3B, the space K through which the fire door can pass is provided between the second end 40b and the downstream rail 22. Note that the configuration of the extendable rail 24 is not limited to the configuration using the plurality of segment rails 42, the elastic members 43 and the like, and another configuration of being able to extend and contract in the X direction may be used.

As illustrated in FIG. 1 and FIGS. 3A and 3B, the movable rail is guided by the guide 25. For example, two guides 25 preferably are disposed above the movable rail 23, for example. The number of guides 25 is not limited to two, and may be one, or three or more. The guide 25 is supported in the state of being suspended from the system ceiling 13 by a suspension member 13c (see FIG. 1). The two guides 25 are disposed, for example, parallel or substantially parallel to the XY plane and disposed in the state of being inclined at an angle θ (e.g., 45°) with respect to the X direction. The guide 25 guides the movable rail 23 in a direction inclined at about 45° with respect to the X direction. This enables movement of the movable rail 23 in the direction inclined at about 45° with respect to the X direction. Note that the inclination angle θ (the guiding direction of the movable rail 23) of the guide 25 with respect to the X direction is not limited to about 45° and may be an angle different from about 45°, for example. The end surface 23b of the movable rail 23 and the end surface 22a of the downstream rail 22 are also preferably inclined at the angle θ (e.g., about 45°) with respect to the X direction, similarly to the guide 25. That is, the two guides 25, the end surface 23b of the movable rail 23, and the end surface 22a of the downstream rail 22 are inclined at the same or substantially the same angle θ with respect to the X direction.

The stopper 26 is attached to the downstream rail 22. The stopper 26 restricts the movable rail 23 from moving beyond the first position P1 in the moving direction from the second position P2 toward the first position P1. The stopper 26 preferably has, for example, a rectangular block shape or a plate shape and has a flat portion 26a. In the stopper 26, the +X side end of the flat portion 26a is fixed to the +Y side surface of the downstream rail 22, and the −X side end is disposed protruding in the −X direction from the downstream rail 22. The flat portion 26a comes into contact with the +Y side surface of the movable rail 23 disposed at the first position P1 and restricts the movable rail 23 from moving.

By restricting the movable rail 23 from moving beyond the first position P1, the stopper 26 is able to accurately hold the movable rail 23 at the first position P1. Whether or not to provide the stopper 26 is completely optional, and the stopper 26 may be omitted. An elastic member such as rubber or a spring may be disposed on the flat portion 26a in order to reduce or eliminate the impact of the movable rail 23. Alternatively, the stopper 26 may be an electromagnet that attracts a portion of the movable rail 23 and holding it at the first position P1.

Figure 5A:
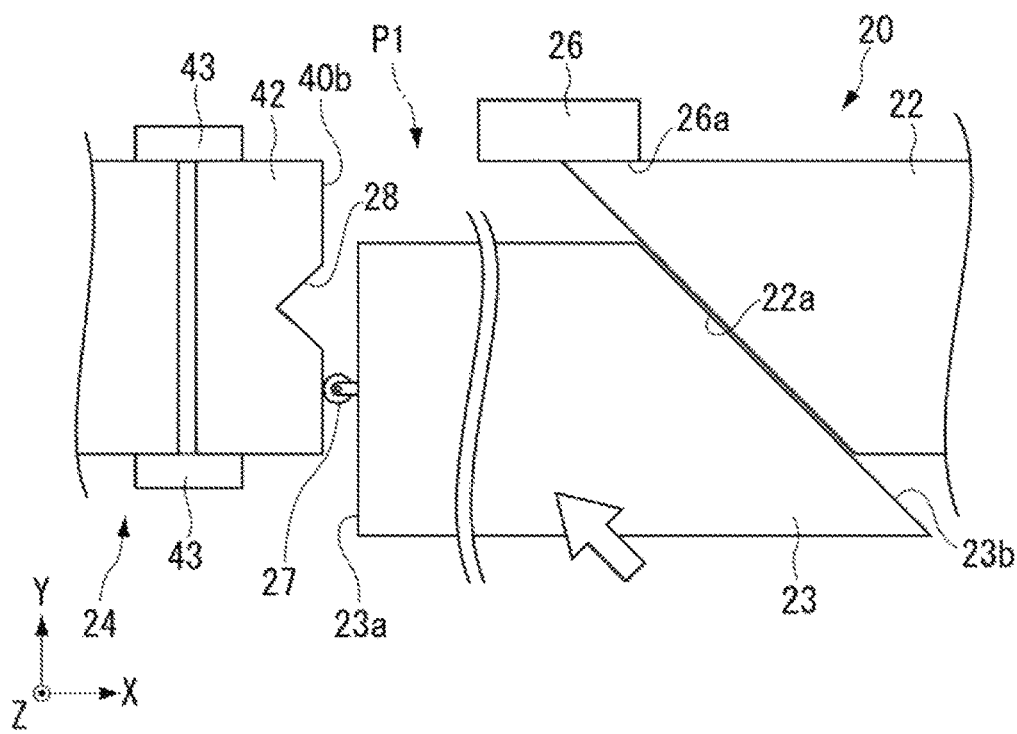
FIGS. 5A and 5B are plan views illustrating a connecting portion between the movable rail and the extendable rail, where
Figure 5B:
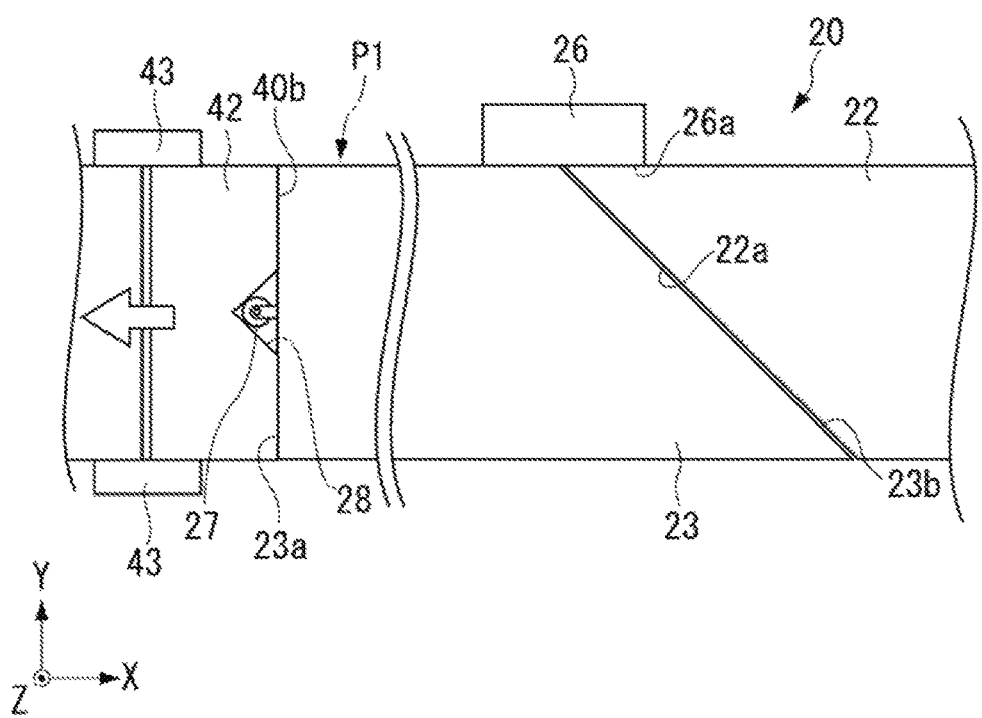

FIGS. 5A and 5B are plan views illustrating a connecting portion between the movable rail 23 and the extendable rail 24. FIG. 5A illustrates a state in which the movable rail 23 is moving toward the first position P1, and FIG. 5B illustrates a state in which the movable rail 23 has reached the first position P1. As illustrated in FIGS. 5A and 5B, the movable rail 23 includes a contact surface 23a to come into contact with the second end 40b of the extendable rail 24. The contact surface 23a is preferably almost parallel to the surface of the second end 40b.

On the contact surface 23a, a guide roller 27 is provided. As illustrated in FIG. 5A, the guide roller 27 is disposed so as to protrude from the contact surface 23a toward the −X side. When the movable rail 23 moves toward the first position P1, the guide roller 27 comes into contact with the second end 40b and rolls on the second end 40b along with the move of the movable rail 23. When the movable rail 23 further moves from the state illustrated in FIG. 5A, the extendable rail 24 is pushed by the guide roller 27 and contracted. Note that, for example, one guide roller 27 is disposed on the contact surface 23a, but it is not limited thereto, and a plurality of guide rollers 27 may be disposed. When the plurality of guide rollers 27 are disposed, the length of each protrusion from the contact surface 23a to the −X side may be made equal to or different from each other.

Further, a recess 28 is provided in the second end 40b. The recess 28 preferably has a size capable of accommodating the guide roller 27. In the plan view, the recess 28 has a V shape in the −X direction, for example, but it is not limited thereto, and another shape may be used. As illustrated in FIG. 5B, the recess 28 is provided at a position where the guide roller 27 enters when the movable rail 23 reaches the first position P1. At this time, the extendable rail 24 is in a contracted state due to transformation of the elastic member 43. However, that the extendable rail 24 leaves room for further shrinkage is as described above. When a plurality of guide rollers 27 are provided, a plurality of recesses 28 are also provided in accordance with the guide rollers 27. When the plurality of recesses 28 are provided, they may have the same shape or different shapes.

Disposing the guide roller 27 on the contact surface 23a of the movable rail 23 and disposing the recess 28 in the second end 40b enable smooth connection of the movable rail 23 and the extendable rail 24 by using the guide roller 27. Further, entry of the guide roller 27 into the recess 28 facilitates horizontal positioning of the movable rail 23 and the extendable rail 24. Instead of the above configuration, the guide roller 27 may be disposed at the second end 40b, and the recess 28 may be disposed on the contact surface 23a. When each of the number of the guide rollers 27 and the number of the recesses 28 is two or larger, the guide roller 27 and the recess 28 may be provided in the second end 40b and the recess 28, respectively.

Figure 6A:
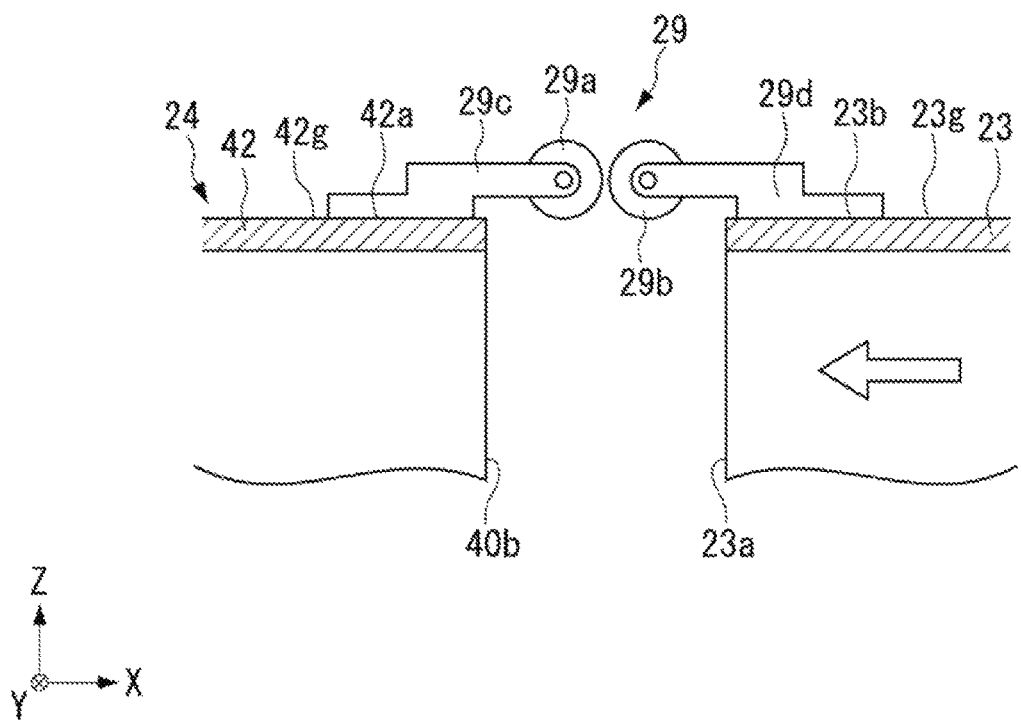
FIGS. 6A and 6B are sectional views illustrating the connecting portion between the movable rail and the extendable rail, where
Figure 6B:
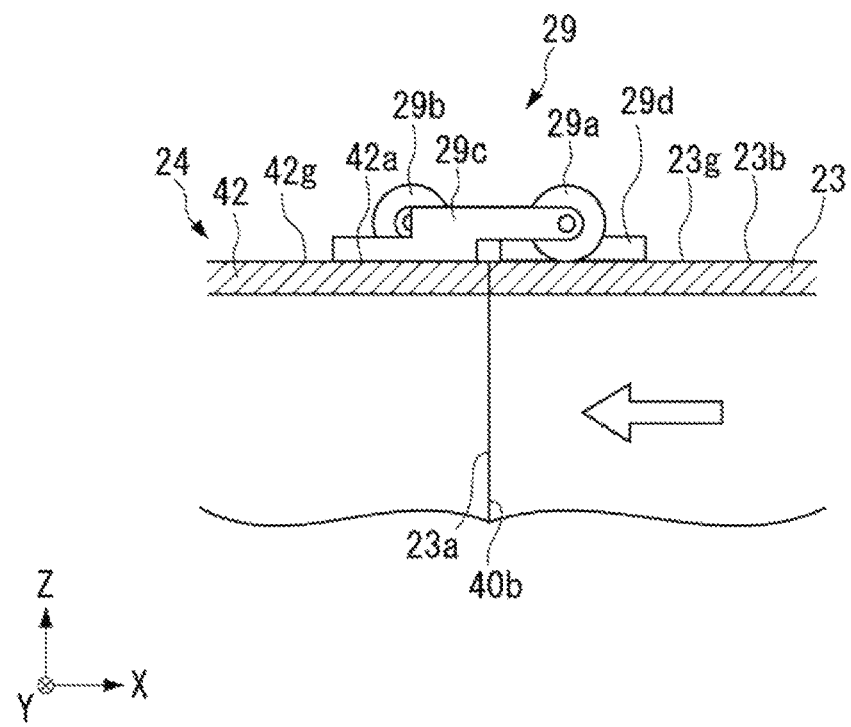
Figure 7A:
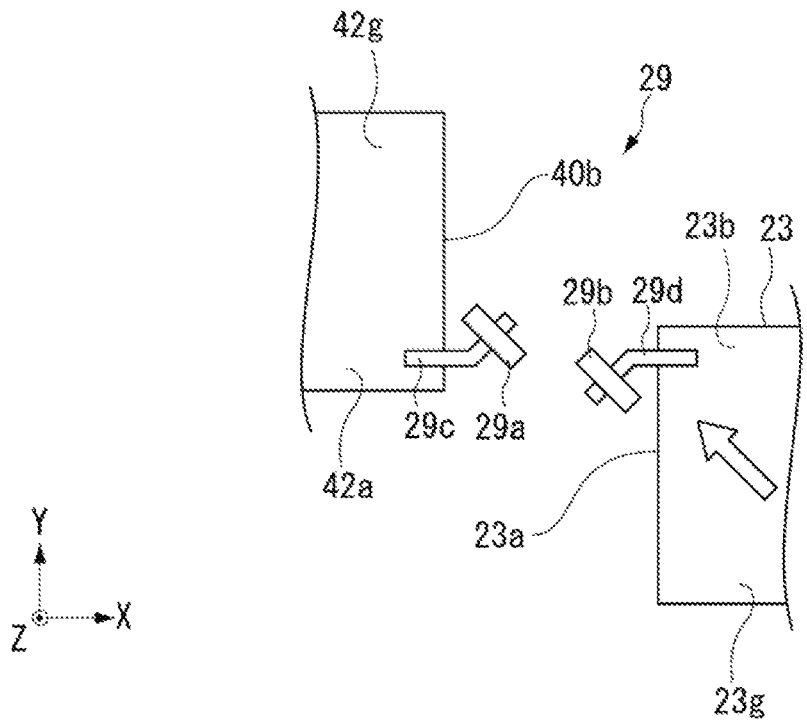
FIGS. 7A and 7B are plan views illustrating the connecting portion of FIGS. 6A and 6B, where
Figure 7B:
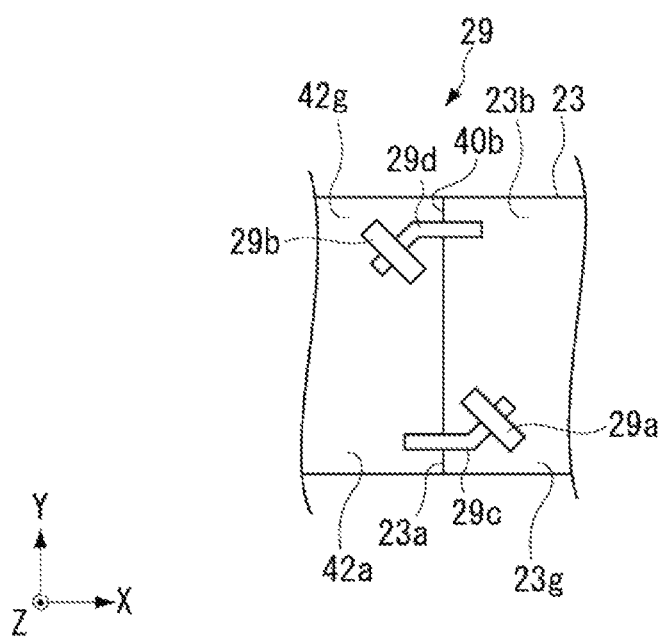

FIGS. 6A and 6B are sectional views illustrating the connecting portion between the movable rail 23 and the extendable rail 24. FIGS. 7A and 7B are plan views illustrating connecting portion in FIGS. 6A and 6B. FIGS. 6A and 7A show a state in which the two rails are separated from each other, and FIGS. 6B and 7B show a state in which the two rails are connected to each other. As illustrated in FIGS. 6A, 6B, 7A and 7B, a positioning mechanism 29 in the vertical direction (the Z direction) is provided at the connecting portion between the movable rail 23 and the extendable rail 24.

The positioning mechanism 29 vertically positions the extendable rail 24 and the movable rail 23 disposed at the first position P1. The positioning mechanism 29 includes rollers 29a and 29b. The roller 29a is fixed by a fixing member 29c to the upper surface 42a of the plate-shaped member provided on the segment rail 42 disposed on the most +X side, for example. Although the roller 29a is provided at one location, it is not limited thereto, and a plurality of rollers 29a may be disposed side by side in the Y direction. The roller 29a is disposed at a position protruding from the segment rail 42 toward the +X side. The roller 29a is able to roll in the direction of about 45° corresponding to the moving direction of the movable rail 23. When the movable rail 23 is disposed at the first position P1, the roller 29a comes into contact with a guide surface 23g on the upper surface 23b of the plate-shaped member provided on the movable rail 23, and rolls thereon.

The roller 29b is fixed by a fixing member 29d to the upper surface 23b of the plate-shaped member on the upper side of the movable rail 23. Although the roller 29b is provided at one location, it is not limited thereto, and a plurality of rollers 29b may be disposed side by side in the Y direction. The roller 29b is disposed at a position projecting from the movable rail 23 to the −X side. Similarly to the roller 29a, the roller 29b is able to roll in the direction of about 45° corresponding to the moving direction of the movable rail 23, for example. When the movable rail 23 is disposed at the first position P1, the roller 29b comes into contact with the guide surface 42g on the upper surface 42a of the plate-shaped member provided on the segment rail 42 on the most +X side, and rolls thereon.

As illustrated in FIG. 6B and FIG. 7B, when the movable rail 23 moves toward the first position P1, the roller 29a comes into contact with the guide surface 23g of the movable rail 23 and rolls thereon. Further, the roller 29b comes into contact with the guide surface 42g of the segment rail 42 and rolls thereon. As a result, the movable rail 23 and the segment rail 42 on the most +X side are vertically positioned by the rollers 29a, 29b.

In the present preferred embodiment, the roller 29a is disposed on the segment rail 42, and the roller 29b is disposed on the movable rail 23. Thus, when the movable rail 23 moves to the first position P1, the roller 29a on the segment rail 42 side rides on the guide surface of the movable rail 23 and the roller 29b rides on the guide surface 42g of the segment rail 42 from the movable rail 23 side. This brings the movable rail 23 and the segment rail 42 into the state of being restricted by the rollers 29a, 29b from moving vertically. Therefore, even when the free end side of the segment rail 42 is positioned below the movable rail 23 under the influence of gravity, at the time when the movable rail 23 moves to the first position P1, the movable rail 23 and the segment rail 42 is able to be vertically positioned in a reliable manner.

Note that the positioning mechanism 29 is not limited to the configuration using the roller 29a and the roller 29b. For example, one of the segment rail 42 and the movable rail 23 may be provided with a protruding piece, and the other may be provided with a vertical V groove. In this case, such a configuration may be used where, by the movable rail 23 moving to the first position P1, the protruding piece is guided by the V groove to vertically position the segment rail 42 (the extendable rail 24) and the movable rail 23.

Subsequently, the operation or function of the above travelling vehicle system 100 will be described. For example, when the travelling vehicle 30 travels on the travelling rail 20, the movable rail 23 is disposed at the first position P1. When the movable rail 23 is disposed at the first position P1, the extendable rail 24 contracts while leaving room for further shrinkage, and the interval between each of the segment rails 42 comes into a reduced state.

Figure 8:
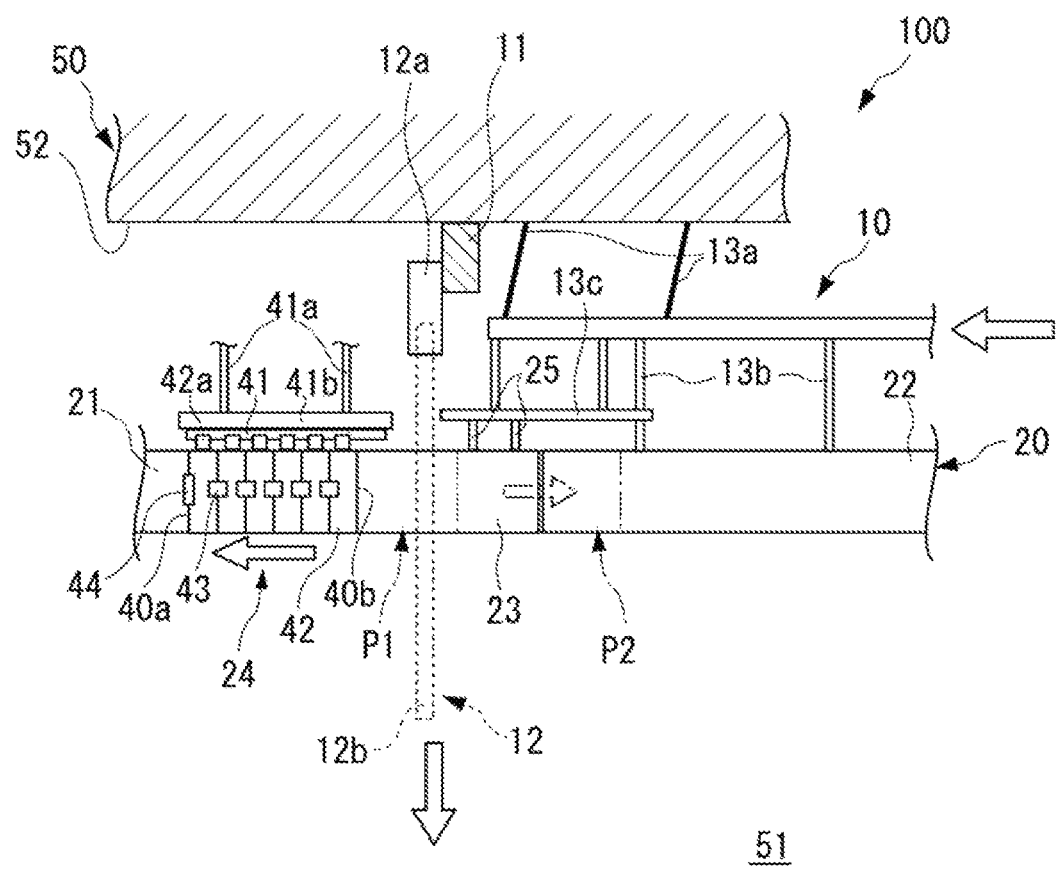
FIG. 8 is a view illustrating a state in which the system ceiling has moved toward a fire wall.
Figure 8:
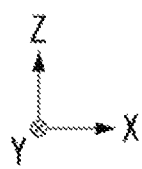
Figure 9:
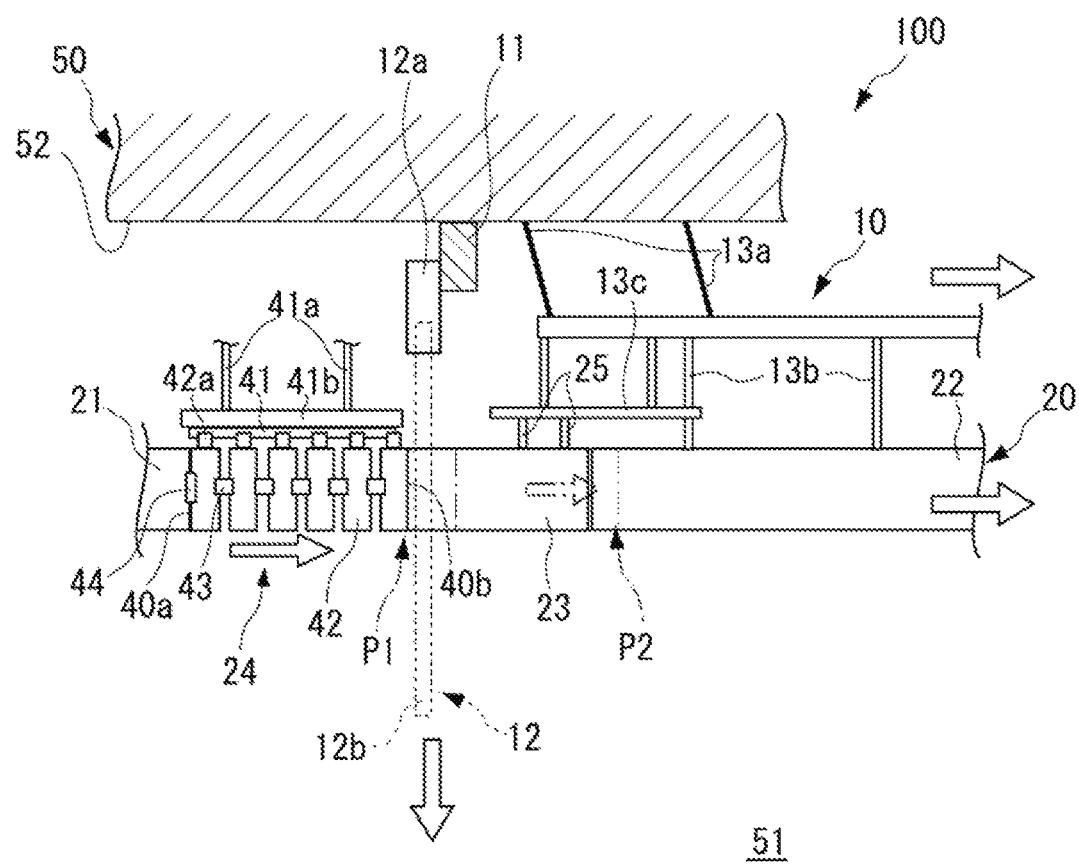
FIG. 9 is a view illustrating a state in which the system ceiling has moved in a direction away from the fire wall.

When an earthquake or the like occurs in this state, with the system ceiling 13 suspended from the ceiling 52 of the building 50 by the suspension member 13a, the building 50 vibrates, so that the system ceiling 13 moves horizontally to the building 50. FIGS. 8 and 9 are views illustrating a state in which the system ceiling 13 has moved horizontally to the building 50.

As illustrated in FIG. 8, when the system ceiling 13 moves in the −X direction with respect to the building 50 (the fire wall 11), the downstream rail 22 and the movable rail 23 move in the −X direction along with the move of the system ceiling 13. As a result, the extendable rail 24 is pushed in the −X direction by the movable rail 23 to come into a further contracted state. With the extendable rail 24 leaving room for further contracting as described above, even when the movable rail 23 further moves in the −X direction, the extendable rail 24 contracts to deal with the movement. By contracting in the −X direction, the elastic member 43 comes into the state of occurrence of elastic force in the +X direction.

In the state illustrated in FIG. 8, the movable rail 23 has been pushed in the +X direction by the elastic force of the extendable rail 24, but even in this state, the movable rail 23 is able to be moved to the second position P2. When the movable rail 23 is moved to the second position P2, the extendable rail 24 extends while being released from the contraction, but the space K (see FIG. 3B) is provided between the extendable rail 24 and the movable rail 23.

The fire shutter 12b is thus able to be lowered through the space K, to provide the desired fire protection zone 51. As a result, for example, even when a fire occurs in the building 50 after the earthquake, there is a high possibility that the spread of the fire is prevented by the fire protection zone 51. Even when the movable rail 23 is strongly pushed in the +X direction by the elastic force of the extendable rail 24 and moves from the first position P1, the movable rail 23 is able to be moved to the second position P2.

As illustrated in FIG. 9, when the system ceiling 13 moves in the +X direction with respect to the building 50 (the fire wall 11), the downstream rail 22 and the movable rail 23 move in the +X direction along with the move of the system ceiling 13. As a result, the extendable rail 24 in the contracted state extends in the +X direction along with the move of the movable rail 23. This prevents the distance between the extendable rail 24 and the movable rail 23 from becoming wider, to avoid keeping the travelling vehicle 30 from becoming unable to travel or avoid giving vibration to the travelling vehicle 30, so that smooth travelling of the travelling vehicle 30 is ensured.

Further, also in the state illustrated in FIG. 9, the movable rail 23 is able to be moved to the second position P2. It is similar to the case illustrated in FIG. 8 that, by the movable rail 23 moving to the second position P2, the space K (see FIG. 3B) is provided between the extendable rail 24 and the movable rail 23 to enable lowering of the fire shutter 12b, thus providing a desired fire protection zone 51.

Although FIGS. 8 and 9 illustrate the case in which the downstream rail 22 (the system ceiling 13) moves in the X direction, even when the downstream rail 22 moves in another direction (e.g., the Y direction) in addition to the X direction, the movable rail 23 is able to move from the first position P1 to the second position P2 and able to provide the space K through which the fire shutter 12b is able to pass, so that the fire shutter 12b is able to be lowered to provide the fire protection zone 51.

As described above, in the travelling vehicle system 100 according to the present preferred embodiment, when the movable rail 23 is disposed at the first position P1, the extendable rail 24 is in the contracted state, so that even when the positions of the upstream rail 21 and the downstream rail 22 fluctuate, the extendable rail 24 is able to be held in a favorably connected state with the movable rail 23 by extending and contracting. Hence, it is possible to reliably retract the movable rail 23 toward the second position P2 and lower the fire shutter 12b. Further, the distance between the upstream rail 21 and the movable rail 23 is prevented from becoming wider by the extendable rail 24, to avoid keeping the travelling vehicle 30 from becoming unable to travel or avoid causing vibration to be applied to the travelling vehicle 30, so that smooth travelling of the vehicle 30 is ensured.

Although the preferred embodiments have been described above, the technical scope of the present invention is not limited to the above descriptions, and various changes can be made within the scope not deviating from the gist of the present invention. For example, in the above preferred embodiments, the configuration in which the extendable rail 24 is provided on the upstream rail 21 and the movable rail 23 advances and retreats between the extendable rail 24 and the downstream rail 22 has been described as an example, but the present invention is not limited to this configuration. For example, a configuration in which the extendable rail 24 is provided on the downstream rail 22 and the movable rail 23 advances and retreats between the extendable rail 24 and the upstream rail 21 may be used.

Further, in the above preferred embodiments, the configuration in which the upstream rail 21, the downstream rail 22, and the movable rail 23 are attached to the system ceiling 13 has been described as an example, but the present invention is not limited thereto. For example, the upstream rail 21, the downstream rail 22, and the movable rail 23 may be attached to the ceiling 52 of the building 50.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A travelling vehicle system comprising:
   travelling rails for a travelling vehicle; and
   a guide roller; wherein
   the travelling rails include:
   an upstream rail and a downstream rail attached to a system ceiling provided in a building;
   a movable rail movable between a first position at which the movable rail communicates with the upstream rail and the downstream rail and a second position shifted obliquely away from the upstream rail and the downstream rail; and
   an extendable rail provided on one of the upstream rail and the downstream rail, the extendable rail including a first end coupled with the upstream rail or the downstream rail and a second end defining a free end, the extendable rail being configured to extend with an elastic member when the movable rail moves from the first position to the second position and contract with the elastic member when the movable rail moves from the second position to the first position;
   the extendable rail is configured to contracts so as to leave room for the second end of the extendable rail to be pushed by the movable rail moving from the second position toward the first position;
   the extendable rail is configured to be able to further contract when the movable rail is disposed at the first position;
   when the movable rail moves to the second position, a space through which a fire shutter provided in the building is able to pass is provided between the second end and the upstream rail or the downstream rail;
   the guide roller is provided on one of the movable rail and the extendable rail, and the guide roller is configured to come into contact with the other one of the movable rail and the extendable rail and roll when the movable rail moves toward the first position; and a recess that is provided on the other one of the movable rail and the extendable rail is located at a position in which the guide roller enters when the movable rail reaches the first position.

2. The travelling vehicle system according to claim 1, wherein the extendable rail includes:

a guide provided along an extending direction of the travelling rails; and a plurality of segment rails movable along the guide; and the elastic member is provided between each of the plurality of segment rails.

3. The travelling vehicle system according to claim 2, wherein a stopper is provided on the upstream rail or the downstream rail and prevents the movable rail from moving beyond the first position in a direction in which the movable rail moves from the second position toward the first position.

* * * * *